United States Patent
Giese et al.

(10) Patent No.: US 8,948,429 B2
(45) Date of Patent: Feb. 3, 2015

(54) AMPLIFICATION OF A SPEECH SIGNAL IN DEPENDENCE ON THE INPUT LEVEL

(71) Applicant: Siemens Medical Instruments Pte. Ltd., Singapore (SG)

(72) Inventors: Ulrich Giese, Fuerth (DE); Maja Serman, Erlangen-Buckenhof (DE)

(73) Assignee: Siemens Medical Instruments Pte. Ltd., Singapore (SG)

( * ) Notice: Subject to any disclaimer, the term of this patent is extended or adjusted under 35 U.S.C. 154(b) by 0 days.

(21) Appl. No.: 13/782,373

(22) Filed: Mar. 1, 2013

(65) Prior Publication Data
US 2013/0230198 A1 Sep. 5, 2013

(30) Foreign Application Priority Data
Mar. 1, 2012 (DE) .......................... 10 2012 203 253

(51) Int. Cl.
*H04R 25/00* (2006.01)
*H03G 3/20* (2006.01)
*G10L 21/00* (2013.01)

(52) U.S. Cl.
CPC .............. *H03G 3/20* (2013.01); *H04R 25/356* (2013.01); *H04R 2225/43* (2013.01); *H04R 2225/41* (2013.01)
USPC .......................................... 381/321; 704/208

(58) Field of Classification Search
USPC ...................... 381/312–321, 60, 91, 92, 310; 704/200.1, 255, 256.1, 271, 208
See application file for complete search history.

(56) References Cited

U.S. PATENT DOCUMENTS

| | | | | |
|---|---|---|---|---|
| 5,903,655 A | * | 5/1999 | Salmi et al. | 381/321 |
| 6,198,830 B1 | * | 3/2001 | Holube et al. | 381/321 |
| 2007/0140512 A1 | | 6/2007 | Hain et al. | |
| 2011/0137649 A1 | | 6/2011 | Rasmussen et al. | |

FOREIGN PATENT DOCUMENTS

DE    10 2005 061 000 A1    6/2007

OTHER PUBLICATIONS

Pape S. et al. Parallele Kompression in Abhängigkeit vom mittleren Eingangspegel in Hörgeräten Siemens AG, 2011—English abstract.

* cited by examiner

*Primary Examiner* — Curtis Kuntz
*Assistant Examiner* — Sunita Joshi
(74) *Attorney, Agent, or Firm* — Laurence A. Greenberg; Werner H. Stemer; Ralph E. Locher

(57) ABSTRACT

Hearing apparatuses, in particular hearing aids, have improved intelligibility. This is accomplished by a method for amplifying a speech signal for a hearing apparatus by detection of an input sound, determining an input level of the input sound and amplification of the input sound. A mean input level of the input sound is determined and it is established whether the input sound has a speech component. If not, the input signal is amplified in dependence on the input level in accordance with a predefined first amplification characteristic. However, if a speech component is found, the input signal is amplified in dependence on the input level in accordance with a predefined second amplification characteristic. The second amplification characteristic is formed in dependence on the mean input level such that amplification is increased with respect to first amplification characteristic in a predefined level interval below the mean input level.

8 Claims, 3 Drawing Sheets

AMPLIFICATION OF A SPEECH SIGNAL IN DEPENDENCE ON THE INPUT LEVEL

CROSS-REFERENCE TO RELATED APPLICATION

This application claims the priority, under 35 U.S.C. §119, of German application DE 10 2012 203 253.3, filed Mar. 1, 2012; the prior application is herewith incorporated by reference in its entirety.

BACKGROUND OF THE INVENTION

Field of the Invention

The present invention relates to a method for amplifying a speech signal for a hearing apparatus by detection of an input sound by the hearing apparatus, determining an input level of the input sound and amplification of the input sound by the hearing apparatus. The present invention also relates to a hearing apparatus having a detection device for detecting an input sound, a measuring device for determining an input level of the input sound and an amplification device for amplifying the input sound. A hearing apparatus is here taken to mean any device which can be worn in or on the ear and which generates an acoustic stimulus, in particular a hearing aid, headset, headphones and the like.

Hearing aids are wearable hearing apparatuses that are used to support the hard of hearing. Different hearing aid designs, such as behind-the-ear hearing aids (BTE), hearing aids with an external receiver (RIC: receiver in the canal) and in-the-ear hearing aids (ITE), for example also concha hearing aids or completely-in-canal hearing aids (ITE, CIC) are provided in order to accommodate the numerous individual requirements. The hearing aids listed by way of example are worn on the outer ear or in the auditory canal. However, bone conduction hearing aids, implantable or vibrotactile hearing aids are also commercially available, moreover. In this case damaged hearing is either mechanically or electrically stimulated.

In principle hearing aids have as their fundamental components an input converter, an amplifier and an output converter. The input converter is usually a sound pick-up, for example a microphone and/or an electromagnetic receiver, for example an induction coil. The output converter is usually implemented as an electroacoustic converter, for example a miniature loudspeaker, or as an electromechanical converter, for example a bone conduction receiver. The amplifier is conventionally integrated in a signal processing unit. The basic construction is shown in FIG. 1 using the example of a behind-the-ear hearing aid. One or more microphone(s) 2 for receiving the sound from the environment are fitted in a hearing aid case 1 for wearing behind the ear. A signal processing unit 3, which is also integrated in the hearing aid case 1, processes the microphone signals and amplifies them. The output signal of the signal processing unit 3 is transmitted to a loudspeaker or receiver 4 which outputs an acoustic signal. The sound is optionally transmitted via a sound tube, which is fixed to an otoplastic in the auditory canal, to the eardrum of the wearer of the hearing aid. The energy supply to the hearing aid, and in particular that of the signal processing unit 3, takes place by way of a battery 5 likewise integrated in the hearing aid case 1.

The dynamic range of hearing is significantly reduced in the case of a central hearing impairment. One solution to this problem lies in using hearing aids with compression. Compression in hearing aids has the function of transferring the dynamic range of people with normal hearing into that of the people with hearing difficulties. What is involved in particular here is the shifting of quiet signals into the audible range, but of not amplifying loud signals any further. Dynamic variations are a problem in this connection.

Retention or improvement of the intelligibility when wearing hearing aids is usually the primary aim. A great challenge lies therefore in finding a suitable reduction in the dynamic range for the type of speech signal in particular. The problem in this connection lies in particular in the variations over time in speech levels. Both slow changes in speech level, which reproduce the variations in the overall speech level, and fast changes in speech level, which reproduce the level differences between speech components (vowels, consonants, phonemes), are important.

Signal processing of hearing aids is known from published, non-prosecuted German patent application DE 10 2005 061 000 A1, corresponding to U.S. patent publication No. 2007/0140512, in which an input signal is classified with respect to the current hearing situation. The input signal is amplified in accordance with a first compression algorithm or a second compression algorithm as a function of the classification result.

The aim of some known compression strategies with slow time constants is to maintain the rapid fluctuations in level over time between vowels and consonants. The quiet parts of speech (in particular between vowels) are often inaudible as a result or simply too quiet with this type of compression.

SUMMARY OF THE INVENTION

It is accordingly an object of the invention to provide an amplification of a speech signal in dependence on the input level which overcome the above-mentioned disadvantages of the prior art methods and devices of this general type, which makes quiet parts of speech audible without significantly raising the overall level of the speech signal.

According to the invention, the object is achieved by a method for amplifying a speech signal for a hearing apparatus by detection of an input sound by the hearing apparatus. An input level of the input sound is determined and the input sound is amplified by the hearing apparatus. A mean broadband input level of the input sound is determined. It is determined whether the input sound has a speech component, and if not, the input signal is amplified in dependence on the input level in accordance with a predefined first amplification characteristic, if so, the input signal is amplified in dependence on the input level in accordance with a predefined second amplification characteristic. The second amplification characteristic is formed in dependence on the mean broadband input level such that amplification is increased with respect to the first amplification characteristic in a predefined level interval below the mean broadband input level. An amplification characteristic is the function of amplification over the input level here. "Broadband" is here taken to mean the overall spectral bandwidth of signal processing of the hearing apparatus.

According to the invention a hearing apparatus is also provided. The hearing apparatus has a detection device for detecting an input sound, a measuring device for determining an input level of the input sound and an amplification device for amplifying the input sound. A mean broadband input level of the input sound can be determined by the measuring device, it can be established by a classification device of the hearing apparatus whether the input sound has a speech component. The amplification device can be controlled by the classification device in such a way that the input signal is amplified in dependence on the input level in accordance with a predefined first amplification characteristic if no speech component is found in the input signal, and the input signal is amplified in dependence on the input level in accordance with a predefined second amplification characteristic if a speech component is found in the input signal. The second amplification characteristic is formed in dependence on the mean broadband input level such that amplification is increased with respect to the first amplification characteristic in a predefined level interval below the mean broadband input level.

An adaptive elevation of speech signals advantageously occurs therefore in dependence on the input level. This is achieved in that the amplification in a predetermined range below the mean broadband current input level, which is roughly the level of vowels, is higher in the case of a detected speech signal than in the case where no speech signal is detected. The level of consonants in particular may be increased as a result, so, overall, intelligibility increases significantly.

The predefined level interval is preferably a mean interval between a vowel level and a consonant level at the input. The vowel level is the level for which the mean can be measured in the case of vowels in a current speech signal. The consonant level is the level for which the mean is measured in the case of consonants in current speech. Since the vowel level substantially corresponds to the overall speech level and is therewith easy to measure, the consonant level can be easily determined with the known level interval from the measured vowel level. The mean interval between the vowel level and the consonant level is known for average speakers in the case of loud and quiet speech.

The second amplification characteristic can lie in a level range of predefined breadth above the first amplification characteristic. This means that the second amplification characteristic lies not only above the first amplification characteristic in the case of a fixed input level, but in a greater range of input levels. This range of input levels should cover the fundamental level range of the consonants. The predefined breadth preferably lies roughly in the order of magnitude of the predefined level interval. If the predefined breadth roughly corresponds to the level interval between consonants and vowels and the elevation takes place roughly symmetrically to the mean consonant level, the range of elevation roughly extends to the center between the consonant level and the vowel level.

The values of the second amplification characteristic advantageously lie at a maximum of 12 dB to 24 dB above those of the first amplification characteristic. Intelligibility can best be increased with this elevation between a maximum of 12 and 24 dB.

The method is advantageously applied solely to sound components of the input sound with frequencies above a predefined frequency, e.g. 1,500 Hz, in particular above 3,000 Hz. This is because consonants have significant frequency components above 1,500 Hz. With respect to intelligibility it is substantially sufficient if frequency components are elevated above 3,000 Hz using the inventive method.

The second amplification characteristic can be increased differently with respect to the first amplification characteristic in various frequency bands. The speech signal components are elevated in dependence on frequency in addition to dependence on the input level. This increases intelligibility and the natural sound impression is consequently better retained as well.

It is also advantageous if amplification is performed in a first path and a second path, parallel thereto, of the hearing apparatus. A first compression is performed in the first path and a second compression is performed in the second path, the second compression is greater than the first compression, and in the second path amplification takes place in accordance with the first and second amplification characteristic. An advantageous, non-linear compression can be achieved by the overlaying of two different compression characteristics. In particular the signals of the first and second paths can be mixed with a mixing ratio which depends on the input level of the input sound. The compression can be dynamically adjusted to the current input sound thereby. At the same time, intelligibility may be increased when using the different amplification characteristics for speech signals and non-speech signals.

Other features which are considered as characteristic for the invention are set forth in the appended claims.

Although the invention is illustrated and described herein as embodied in an amplification of a speech signal in dependence on the input level, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

The exemplary embodiments described in more detail below are preferred embodiments of the present invention.

It has been found that intelligibility depends inter alia on the ratio of the consonant level to the vowel level in the speech signal of an individual speaker. In this connection the consonant level means the mean level of consonants and the vowel level the mean level of vowels in speech. Intelligibility can be improved by increasing the consonant level, i.e. the level of the consonants, without simultaneously increasing the vowel level (reference level). The improvement in intelligibility achieved in this way is then at its highest if the consonants-vowel ratio (CVR; i.e. interval between the consonant level and the vowel level) is higher than in the case of average speech. Particularly good results with respect to intelligibility have been produced if the consonant level is elevated or increased with respect to the vowel level by up to 12 to 24 dB. This has advantages in particular in the case of consonants in the higher frequency spectrum, i.e. above 1,500 Hz and in particular above 3,000 Hz. Primarily affected by this are fricatives ("s", "sch", "f", etc.) and what are known as stop consonants ("p", "t", etc.).

To be able to benefit from this knowledge, a special compression strategy must be applied which is performed in addition to "normal" compression. A strategy of this kind can be illustrated with the aid of FIG. 2 for a first speech A. For this purpose the hearing apparatus or hearing aid must have a classifier or similar device which can establish whether the input sound has a speech component or not. If a speech component is not detected in the input sound, a level-dependent amplification occurs in accordance with a first amplification characteristic 10 (shown in FIG. 2 as a solid line). It can be seen that the amplification g of the input level $L_i$ depends on the input sound. If, on the other hand, a speech component is found in the input sound, level-dependent amplification occurs in accordance with a second amplification characteristic 11. This is partially on the first amplification characteristic 10 and partially above it.

Figure 1:
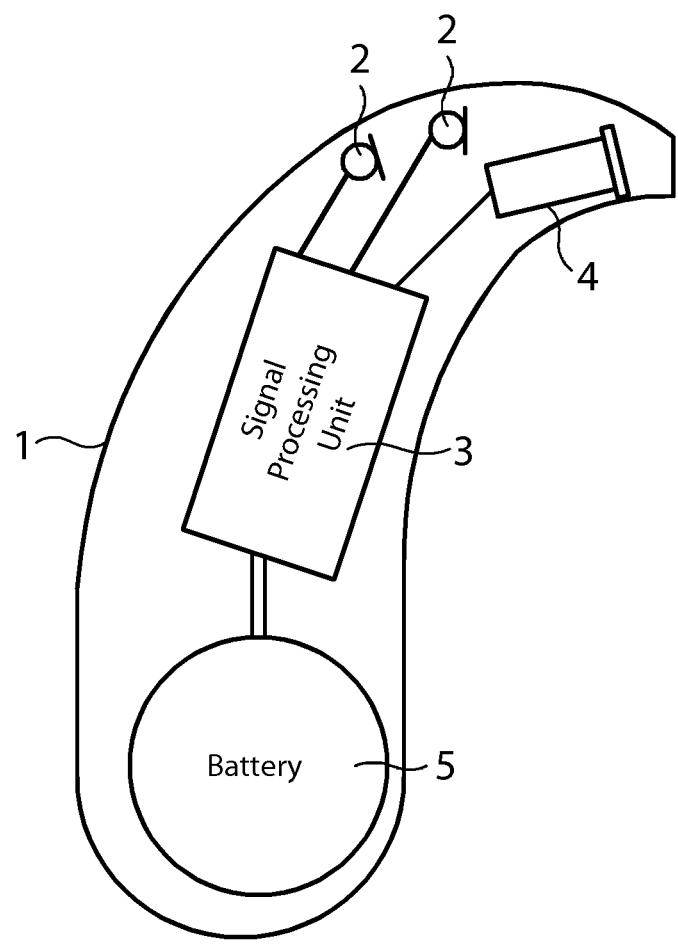
FIG. 1 is a diagrammatic, illustration of a hearing aid according to the prior art.
Figure 2:
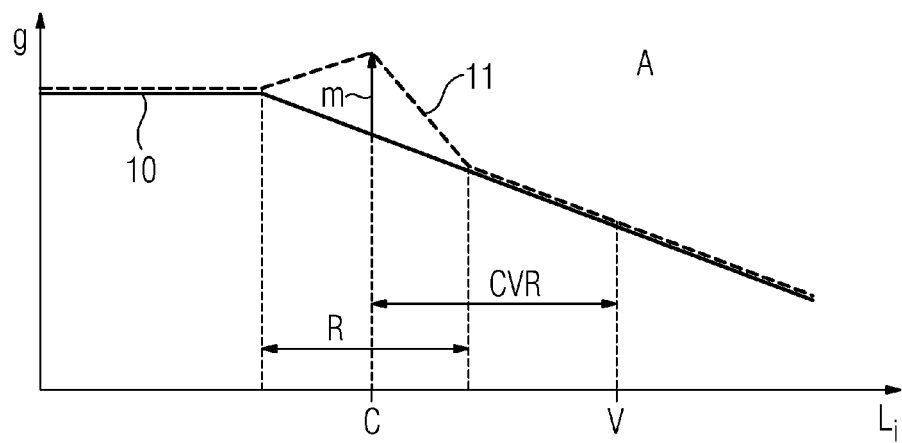
FIG. 2 is a graph showing an amplification characteristic over an input level in the case of first speech according to the invention.
Figure 3:
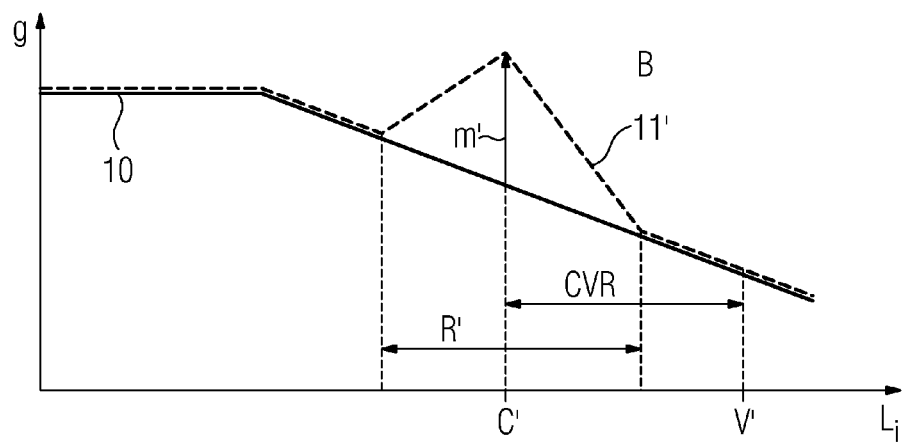
FIG. 3 is a graph showing an amplification characteristic over the input level in the case of second speech according to the invention.

The second amplification characteristic is always adjusted to current speech A (see FIG. 2) or B (see FIG. 3). For this purpose the overall speech level of current speech A or B is measured broadband in a first step (overall processing bandwidth). This overall speech level, which is also called the mean broadband input level here, is dominated by the vowel level V. This means that the overall speech level primarily depends on the volume of the vowels. The ratio of the volumes of consonants to vowels (CVR) is also known. This ratio CVR corresponds to the interval between the vowel level V and the consonant level C. The ratio CVR can be determined by way of a plurality of measurements and averaging. The consonant level C can therefore easily be derived from the overall signal level, which roughly corresponds to the vowel level, by subtracting a standard or mean CVR from the measured overall speech level. A current, significantly lower consonant level C then results for current speech according to the measured overall speech level or vowel level. In the example of FIG. 2 the vowel level V is measured therefore for speech A, and the consonant level C lies in an interval CVR below it. In the example of FIG. 3 the current overall speech level or vowel level V' is measured for speech B, so consonant level C' results minus the standard CVR.

In the case of the determined consonant level C or C' amplification g is now increased with respect to the first amplification characteristic 10. However, amplification is increased not only exactly at value C or C' of input level $L_i$, but also in a region R or R' in each case around the respective value C or C'. The respective second amplification characteristic 11 or 11' then results with this elevation, and this lies, at least in certain regions (in the regions R and R'), above the first amplification characteristic 10.

The first amplification characteristic 10 and the second amplification characteristic 11, 11' preferably run steadily. In other words, they do not exhibit any jumps. The amplification characteristics can be composed of linear sections in this case, as in the examples of FIG. 2 and FIG. 3. The amplification characteristics can also have non-linear courses, however. The respective courses in the amplification characteristics may also be achieved by standard expansion methods and standard compression methods.

In the examples of FIGS. 2 and 3 a maximum elevation m or m' is performed at input level C or C', i.e. at the mathematically determined consonant level. This maximum elevation should lie between 12 and 24 dB. The best results in relation to intelligibility may be achieved with these elevation values. The maximum elevations must not lie at C or C' exactly, however. The respective elevation region in relation to C or C' must not be symmetrical either. It is essential only that C or C' lies in the elevation region R or R'.

The compression elevation should only be applied in the case of high frequency speech components above 1,500 Hz and in particular above 3,000 Hz. This affects what are known as high frequency consonants therefore, whose fundamental frequency components lie above the frequencies. These are fricatives and stop consonants in particular.

Figure 4:
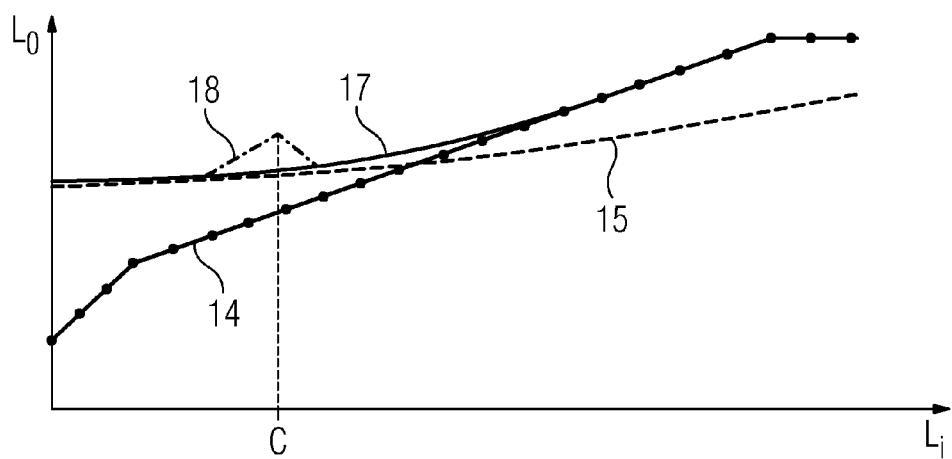
FIG. 4 is a graph showing a parallel compression in dependence on a mean input level in a hearing aid according to the invention.
Figure 5:
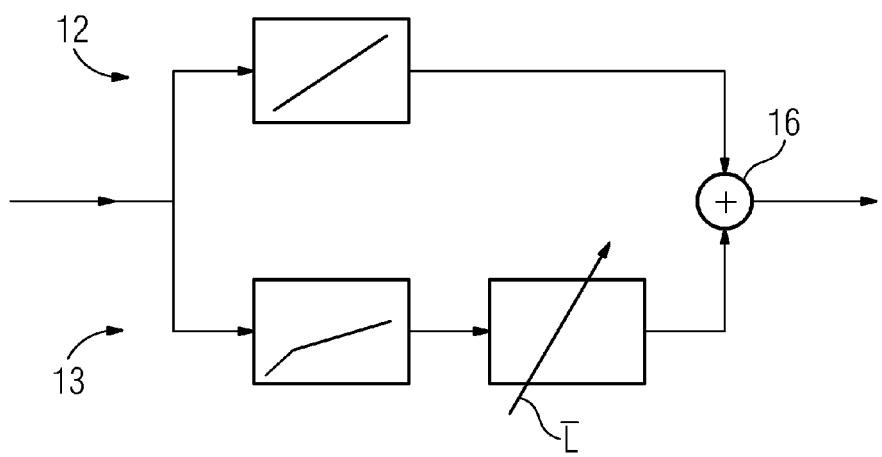
FIG. 5 is a block diagram of an electrical circuit diagram for the implementation of a parallel compression according to the invention.

As will be illustrated with the aid of FIGS. 4 and 5, the elevation of the amplification in the case of the consonant levels C and C' may be linked to what is known as parallel compression. The problem of simple compression, which operates either very slowly or very quickly, may be remedied by this parallel compression. With very slowly readjusted amplification it is not possible in particular to amplify very quiet details without providing too much amplification for louder signals. If, by contrast, adjustment works very quickly, quiet details become audible. Overall the sound suffers a great deal, however, since the dynamics of natural signals are completely lost. With parallel compression on the other hand, the signal is split onto two channels 12, 13. One channel 13 compresses the signal very moderately and very slowly in accordance with a compression characteristic 14 to primarily avoid output variables which too loud. The other, parallel, channel 12 compresses the input signal very strongly and very quickly in accordance with a compression characteristic 15. At the end the signals of both paths 12, 13 are added again in an adder 16. The mixing ratio of the two channels 12, 13 is determined as a function of a mean input level L averaged over time. The aim of adaptive mixing is to compress as little as possible in the case of very quiet environments, but relatively highly in the case of loud levels. The situation is therefore avoided where quiet background noises from the environment are amplified too much in the silence. Overall, a resulting compression characteristic 17 is then produced which, by way of example at low input levels, is dominated by fast compression 15 and at higher input levels by slow compression 14.

The aim of this compression method is to retain the sound quality of the input signal as far as possible despite higher and fast compression. The clarity of a signal depends to a large extent on pulses which structure the sound pattern. Conventional, fast compression rounds these pulses. The parallel compression method can be parameterized in such a way that the louder pluses are always added to the output signal uncompressed, whereas quiet details can be added via the other channel. The compressed pulses contained therein are covered by those in the uncompressed or very slow channel. Precisely this parameterization can be easily achieved due to the dependency of the mixing ratio on the mean input level.

If speech is then detected in the input signal, the compression characteristic 15 for fast compression can be replaced by a compression characteristic which is based on the second amplification characteristic 11 or 11' (see FIGS. 2 and 3). An additional elevation would result thereby in region C of input level $L_i$. Such an additional elevation 18 is symbolized in FIG. 4 by a dot-dash line. The elevation 18 would be part of the resulting compression characteristic 17 in the case of speech components.

The exemplary embodiments mentioned have the advantage that by using the known interval CVR, specifically the amplification of consonants in the case of compression can easily be increased, so ultimately intelligibility may be improved. In addition, there is an adaption to the current overall level of speech with compression. The interval CVR can be specified in this connection, e.g. for quiet, medium and loud speech.

There is also no abrupt increase in the consonant level, but a gentle transition instead. An abrupt transition in amplification would have the adverse effect of excessively amplifying ambient background noise. The gentle transition, by contrast, smoothes the sound quality and renders the method more robust against other background noises.

The invention claimed is:

1. A method for amplifying a speech signal for a hearing apparatus, which comprises the steps of:
   detecting an input sound via the hearing apparatus;
   determining an input level of the input sound;
   amplifying the input sound via the hearing apparatus;
   determining a mean broadband input level of the input sound;
   determining if the input sound has a speech component;
   amplifying the input signal in dependence on the input level in accordance with a predefined first amplification characteristic if the speech component does not exist; and
   amplifying the input signal in dependence on the input level in accordance with a predefined second amplification characteristic if the speech component exists, the predefined second amplification characteristic being formed in dependence on the mean broadband input level such that amplification is increased with respect to the predefined first amplification characteristic in a predefined level interval below the mean broadband input level, wherein the predefined level interval is a mean interval between a vowel level and a consonant level and the predefined second amplification characteristic lies in a level range of a predefined breadth above the predefined first amplification characteristic.

2. The method according to claim 1, wherein the predefined breadth is in an order of magnitude of the predefined level interval.

3. The method according to claim 1, wherein values of the predefined second amplification characteristic are a maximum of 12 dB to 24 dB above those of the predefined first amplification characteristic.

4. The method according to claim 1, which further comprises applying the method solely to sound components of the input sound having frequencies above a predefined frequency.

5. The method according to claim 1, which further comprises increasing the predefined second amplification characteristic differently with respect to the predefined first amplification characteristic in various frequency bands.

6. The method according to claim 1, which further comprises performing amplification in a first and a second path, parallel thereto, of the hearing apparatus, a first compression is performed in the first path and a second compression is performed in the second path, the second compression is greater than the first compression, and the amplification is carried out in the second path in accordance with the predefined first or second amplification characteristic.

7. The method according to claim 6, which further comprises mixing signals of the first and second paths with a mixing ratio which depends on the input level of the input sound.

8. A hearing apparatus, comprising:
   a detection device for detecting an input sound;
   a measuring device for determining an input level of the input sound, a mean broadband input level of the input sound being determined by the measuring device;
   an amplification device for amplifying the input sound;
   a classification device for determining if the input sound has a speech component; and
   said amplification device can be controlled by said classification device such that the input signal is amplified in dependence on the input level in accordance with a predefined first amplification characteristic if no speech component is found in the input signal, and the input signal is amplified in dependence on the input level in accordance with a predefined second amplification characteristic if the speech component is found in the input signal, the predefined second amplification characteristic is formed in dependence on the mean broadband input level such that amplification is increased with respect to the predefined first amplification characteristic in a predefined level interval below the mean broadband input level, wherein the predefined level interval is a mean interval between a vowel level and a consonant level and the predefined second amplification characteristic lies in a level range of predefined breadth above the predefined first amplification characteristic.

* * * * *